(12) United States Patent
Wheeler

(10) Patent No.: US 10,965,136 B2
(45) Date of Patent: Mar. 30, 2021

(54) MONITORING SYSTEM WITH LOW POWER USAGE

(71) Applicant: LO3 Energy Inc., Brooklyn, NY (US)

(72) Inventor: Zac Wheeler, Portland, OR (US)

(73) Assignee: LO3 Energy Inc., San Francisco, CA (US)

( * ) Notice: Subject to any disclaimer, the term of this patent is extended or adjusted under 35 U.S.C. 154(b) by 0 days.

(21) Appl. No.: 16/209,793

(22) Filed: Dec. 4, 2018

(65) Prior Publication Data

US 2019/0181670 A1    Jun. 13, 2019

Related U.S. Application Data

(63) Continuation of application No. 15/176,050, filed on Jun. 7, 2016, now abandoned.

(60) Provisional application No. 62/172,692, filed on Jun. 8, 2015.

(51) Int. Cl.
*G01R 21/00* (2006.01)
*H02J 7/00* (2006.01)
*G01D 4/00* (2006.01)
*G01D 9/00* (2006.01)
*G01R 19/25* (2006.01)

(52) U.S. Cl.
CPC ............ *H02J 7/0068* (2013.01); *G01D 4/004* (2013.01); *G01D 9/005* (2013.01); *G01R 19/2513* (2013.01); *Y02B 90/20* (2013.01); *Y04S 20/30* (2013.01)

(58) Field of Classification Search
None
See application file for complete search history.

(56) References Cited

U.S. PATENT DOCUMENTS

| | | | |
|---|---|---|---|
| 6,262,550 B1 * | 7/2001 | Kliman | G05B 23/0264 318/565 |
| 6,687,627 B1 | 2/2004 | Gunn et al. | |
| 7,986,968 B2 | 7/2011 | Dobrowski et al. | |
| 9,235,541 B2 | 1/2016 | Theile et al. | |
| 10,728,993 B2 * | 7/2020 | Chen | H05B 45/10 |
| 2007/0165656 A1 | 7/2007 | Dobrowski et al. | |
| 2011/0124654 A1 | 5/2011 | Chen | |
| 2012/0080944 A1 * | 4/2012 | Recker | H05B 45/37 307/25 |
| 2016/0116925 A1 | 4/2016 | Freeman | |
| 2018/0165660 A1 | 6/2018 | High et al. | |

FOREIGN PATENT DOCUMENTS

| | | |
|---|---|---|
| WO | WO 2007/082015 | 7/2007 |
| WO | WO 2007/082018 | 7/2007 |

* cited by examiner

*Primary Examiner* — Aditya S Bhat
(74) *Attorney, Agent, or Firm* — Fish & Richardson P.C.

(57) ABSTRACT

A data logging device including a data request and receiving module receiving an input, a switch circuit receiving said input, a resistive load interconnected to said switch circuit, a data request switch providing a signal to said data request and receiving module, a charge storage device interconnected with said resistive load, a transmitter interconnected with said data request and receiving module.

20 Claims, 5 Drawing Sheets

MONITORING SYSTEM WITH LOW POWER USAGE

CROSS-REFERENCE TO RELATED APPLICATIONS

This application is a continuation application of and claims priority to U.S. application Ser. No. 15/176,050, filed on Jun. 7, 2016, which claims the benefit of U.S. Provisional App. No. 62/172,692, filed Jun. 8, 2015. The entire disclosure of these applications are incorporated by reference herein.

BACKGROUND OF THE INVENTION

The present invention relates a monitoring system with lower power usage.

Referring to FIG. 1, a typical building environment includes many different pieces of equipment with that consume energy, such as motors, lighting, refrigeration, heating, air conditioning, and other industrial manufacturing devices. Each of these devices consumes energy which results in an overall cost to purchase the energy for these devices from a power source, such as a utility. Each of these devices also has an operational lifetime that can be extended by remaining within the designed operational parameters. With the ever increasing complexity of equipment and cost of such energy, there is significant pressure for an organization to monitor the energy usage and performance of the equipment so that equipment life may be extended and further cost effective energy reductions may be identified.

Demand side management programs have been deployed for large industrial environments resulting in replacing high energy consumption lighting devices with low energy consumption lighting devices, and replacing standard drive motors with variable frequency drive motors. While such replacement of energy consuming devices is one aspect of an energy conservation program, it does not provide an effective on-going monitoring of the energy consumption or the equipment's operational parameters.

Referring to FIG. 2, another monitoring system may involve installing a plurality of sensing devices, such as a power meter, each proximate a corresponding piece of equipment. Each of the power meters may include a set of sensors that sense the current and/or voltage provided to the respective power devices. Each of the power meters may include a set of registers that stores information regarding the current, voltage, phase, and/or power usage over time. A set of network cabling is provided from each of the power meters to a centralized power metering device or otherwise using a local wireless connection, such as IEEE 802.11 WiFi, to create a local network. The centralized power metering device may query each the power metering devices, as desired. In response to the query, the power meters provide responsive information to the centralized power metering device. In many cases, the centralized power metering device provides responsive information, to a centralized monitoring system, such as a management console using the Internet. Unfortunately, such a power monitoring system is expensive to install into existing infrastructures.

Similarly, operating devices with built-in sensors and diagnostic or control interfaces may be monitored by systems connected over a local network. They may also be monitored via telecommunications lines and modems that operators can dial in to in order to control the device directly, or modify or view the operational data of the device. These methods typically require human operator involvement to interact with and manipulate the device settings and view the registers. This is a time-intensive and expensive process, both when considering the cost of installing the monitoring infrastructure, and the personnel costs of operating such a fleet of devices when they extend into the thousands and tens of thousands.

The foregoing and other objectives, features, and advantages of the invention will be more readily understood upon consideration of the following detailed description of the invention, taken in conjunction with the accompanying drawings.

DETAILED DESCRIPTION OF PREFERRED EMBODIMENT

Figure 1:
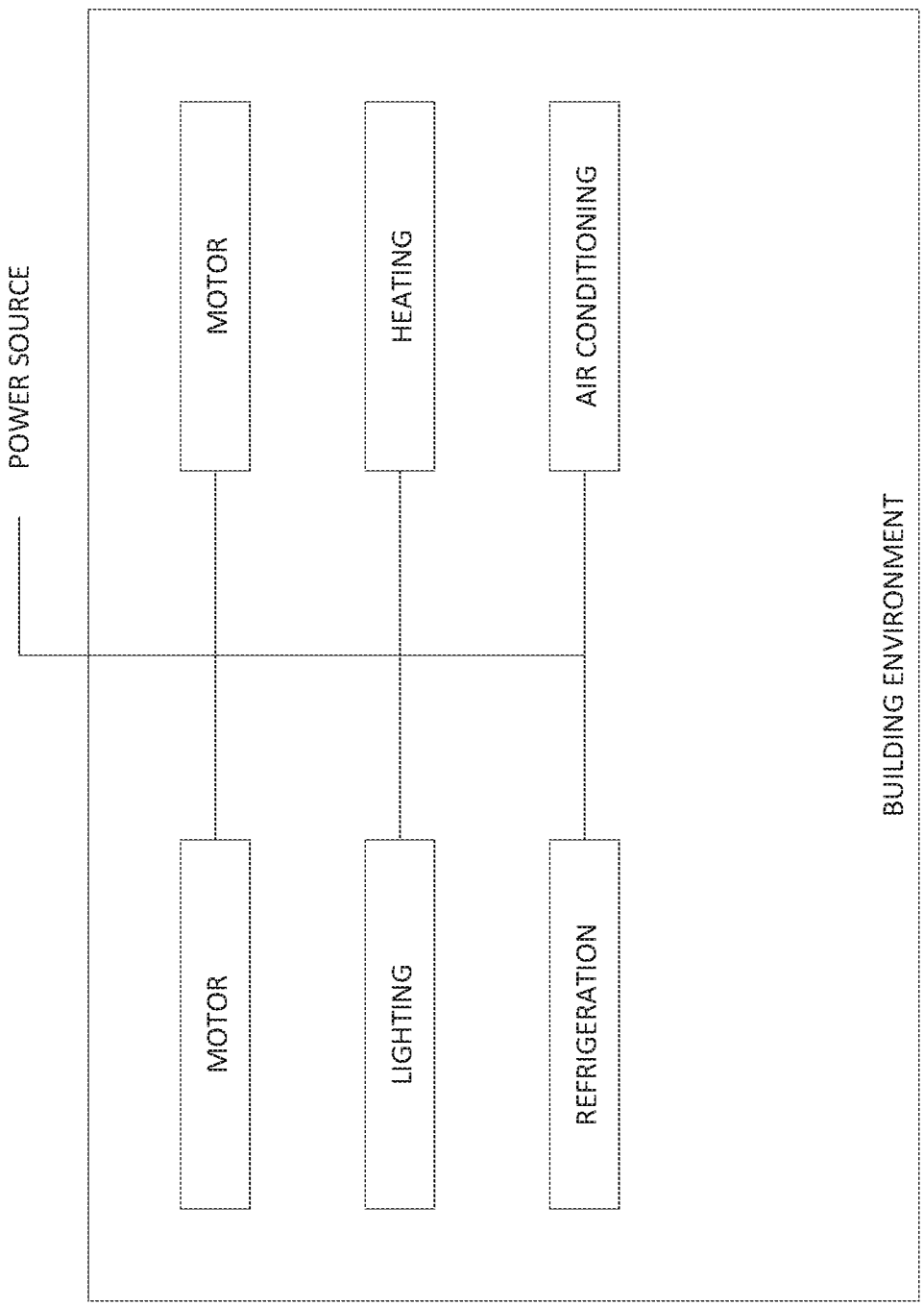
FIG. 1 illustrates a building environment including power consumption devices.
Figure 2:
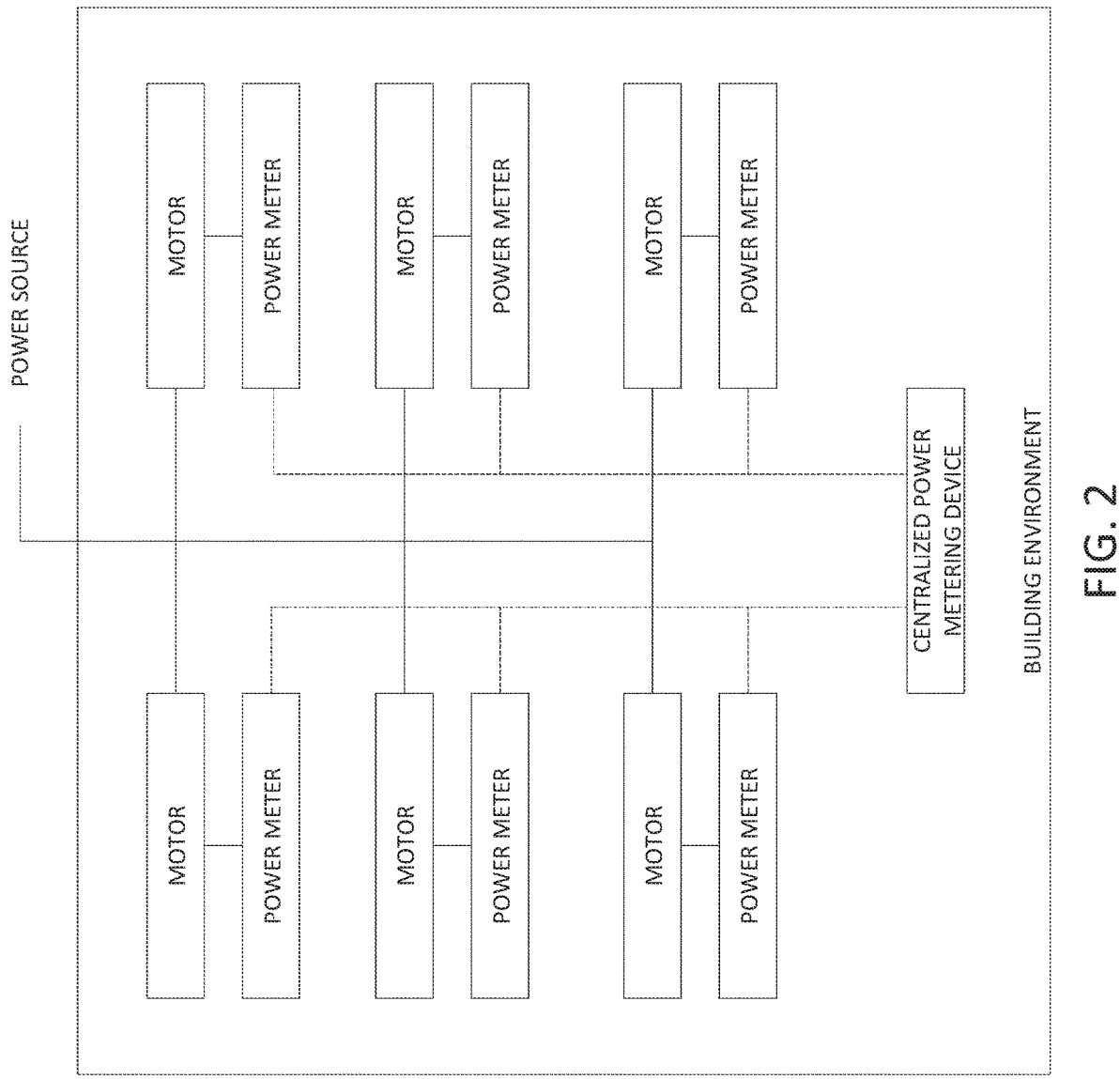
FIG. 2 illustrates a monitoring system for a building with various pieces of equipment.
Figure 3:
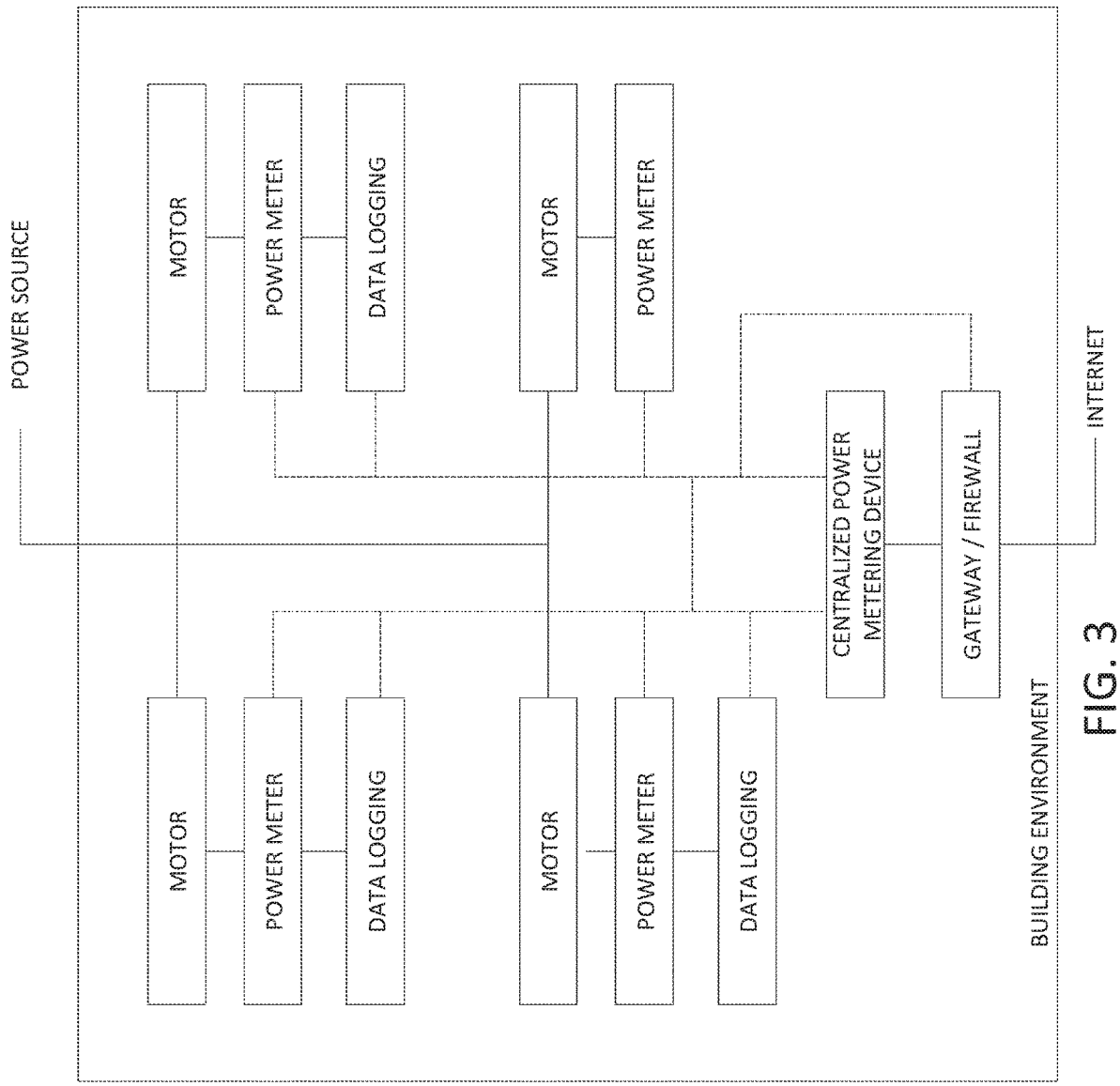
FIG. 3 illustrates a data logging system for a device.

Referring to FIG. 3, a modified building environment includes a plurality of pieces of equipment. The pieces of equipment may include, for example, a current sensor that senses the current to an energy device. The pieces of equipment may include, for example, a temperature sensor that senses the temperature in the plenum of a piece of equipment. The pieces of equipment may include, for example, an occupancy sensor that senses activity local to the sensor to determine whether the space is occupied. The pieces of equipment may include, for example, a power meter that senses the current and voltage to an energy device. The power meter, for example, may include a single phase, two phases, and/or three phases. The pieces of equipment may include, for example, a set of current sensors and a set of voltage sensors that measure the current, voltage, and/or power for a plurality of different energy devices. The pieces of equipment may include, for example, a boiler that heats water for use by the building occupants. The pieces of equipment may include, for example, an air conditioner that cools or dehumidifies the air within a building. The pieces of equipment may include, for example, a water chiller that cools water that is later circulated within the building to cool the air. Preferably, each of the pieces of equipment includes memory that stores data that is sensed, such as temperatures, pressures, flow rates, currents, voltages, apparent power, actual power, power factor, peak current, peak voltage, etc. In this manner, through a communications port, an external device can query the piece of equipment to obtain such data. By way of example, the energy monitoring device may include a RS485 interface and communicate using a MODBUS protocol, and/or include an Ethernet interface and communicate using a MODBUS or BACNET protocol.

One or more data logging devices may be interconnected to the piece of equipment. The data logging device is preferably located at a location that is either adjacent to the piece of equipment or otherwise interconnected to an internal network connected to the piece of equipment. For example, the data logging device may be directly connected to the piece of equipment. For example, the data logging device may be connected to the network connected to the piece of equipment. In either case, the data logging device may query and obtain information from the piece of equipment. In this manner, the data logging device is logically located within the network for the pieces of equipment, such as an RS485 network and/or an Ethernet network. By way of example, the network may include a firewall or otherwise an external gateway to the Internet. By way of example, the network may also include a computer or otherwise a computing device that can send and receive data from the pieces of equipment. By logically including the data logging device within the network, the data logging device does not need to be capable of sending and receiving data through the firewall and/or gateway to gain access to devices interconnected to the network. Furthermore, by logically locating the data logging device within the network, the IT (information technology) department is unlikely required to make modifications to its network to support the data logging device, which reduces the installation expenses related to the data logging device.

The data logging device may, based upon its configuration, query one or more pieces of equipment to obtain data regarding the energy usage. Accordingly, the data logging device may send a query to a particular piece of equipment. In response, the piece of equipment may provide a responsive set of data that is received by the data logging device. The data logging device may store the received data and modify the received data, as appropriate. The data logging device may receive data from a plurality of different pieces of equipment, and maintain the data for each of the pieces of equipment.

In many installations, it is problematic to locate a power source to plug in to the data logging device in order to access building power, such as a standard 120 volt receptacle. Also, if the power goes out for the receptacle, then the data logging device would not be capable of then recording the current measurements from the piece of equipment, which may in some cases is the time when such data is most useful. Accordingly, it may be desirable to include an internal rechargeable battery so that the data logger is operational even without building power. Moreover, to simplify the installation it is desirable to omit including a plug or cord that receives building power, such as standard 120 volt power source. This enables any device with the appropriate communications port to not only communicate, but also to provide power to operate the attached data logging and transmitting device. Without a nearly unlimited power source it is desirable to manage the power usage of the data logger in a manner that conserves energy usage.

Modbus is a serial communications protocol that enables communication among approximately 247 devices connected to the same network. Each device intended to communicate using Modbus is given a unique address. A Modbus command contains the Modbus address of the device it is intended for (1 to 247). Only the intended device will act on the command, even though other devices might receive it. The Modbus commands contain checksum information to allow the recipient to detect transmission errors. The Modbus command can instruct a remote terminal unit to change the value in one of its registers, control, or read an I/O port and command the device to send back one or more values contained in its registers. A Modbus frame is composed of an Application Data Unit (ADU) which encloses a Protocol Data Unit (PDU). The PDU has a function code plus data. The ADU has an address plus PDU plus error check. For example, a Modbus RTU frame may start with 28 bits for silence, then 8 bits for station address, then 8 bits for function code, then n×8 bits for data, 16 bits for cyclic redundancy check, and 28 bits for silence between frames. As it may be observed, the Modbus frame may readily include 128 bits and in many cases significantly more bits.

Figure 4:
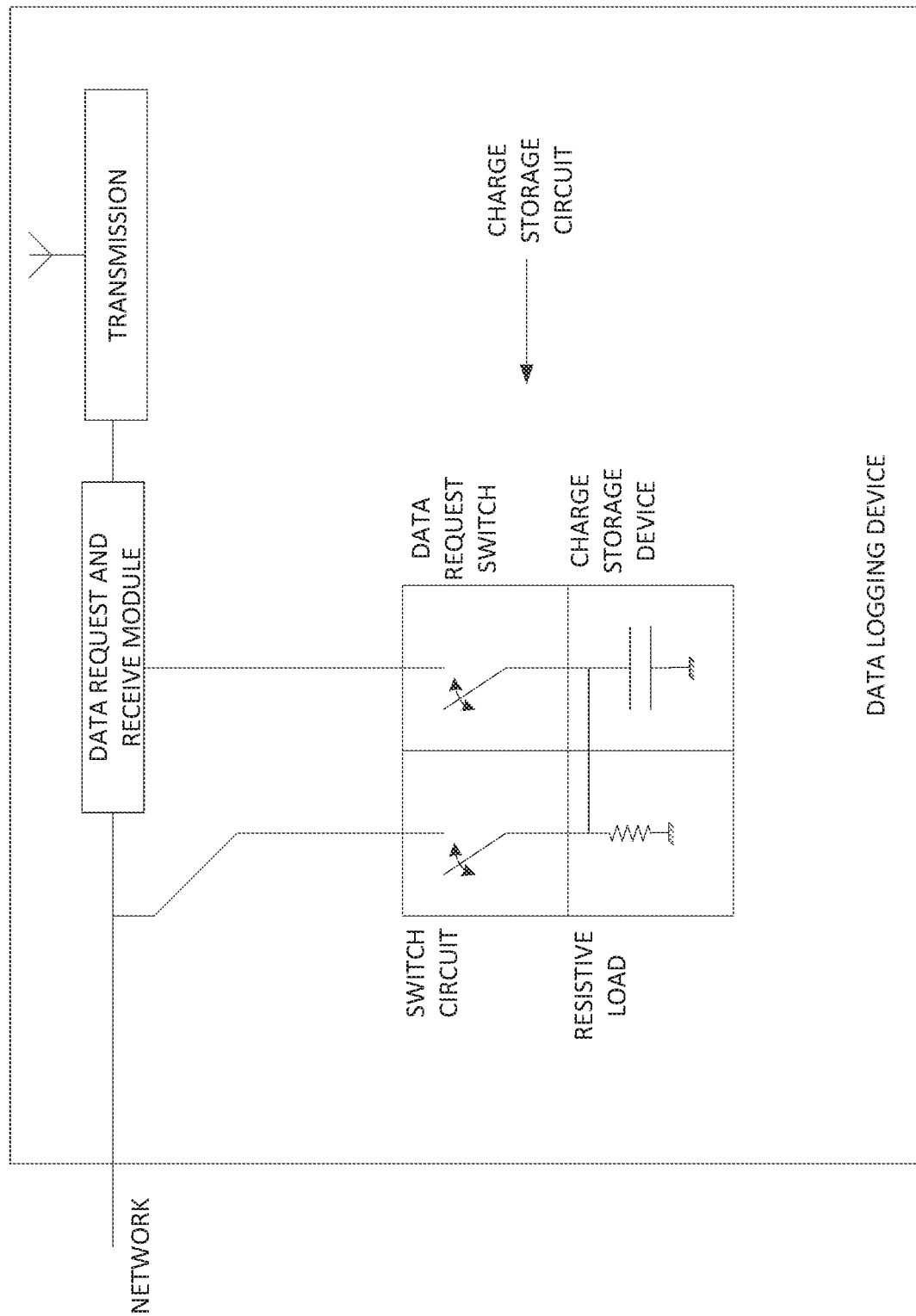
FIG. 4 illustrates a data logger.

Referring to FIG. 4, a data logging device may include a data request and receive module to provide a request on the network that is received by a select energy monitoring device. In response, the select piece of equipment provides a response on the network that is received by the data request and receive module. Often there are data packets broadcast on the network by one or more of the pieces of equipment are not addressed to the particular data logging device. However, due to the nature of network broadcast protocols the data is received by the data request and receive module. After consideration of such network broadcast protocols, it was determined that the broadcast data includes bits which include a substantial amount of energy contained therein. In many cases, after decoding the addressing and determining that the broadcast data is not intended for the data logging device, the remainder of the broadcast data has energy that is not of any particular use to be decoded by the data logging device. In many cases, if there is no recent request for data on the network by the data logging device, then it may be presumed that all the broadcast data on the network is not of any particular use to be decoded by the data logging device.

With the appreciation that energy in the form of unusable bits are being received by the data logging device, while all or a portion of such bits are not needed by the data logging device, it is desirable to include a switch circuit to selectively include a termination resistance in the electrical path of the data bits being received from the network. For example, the termination resistance may be on the order of 100 ohms, but a larger termination resistance may be included. A voltage is imposed across the termination resistance with the switch circuit being closed resulting in an electrical charge that may be used to charge a charge storage device, such as a battery. In this manner, a charge storage circuit may be selectively included within the data logging device. In particular, the charge storage circuit is selectively switched into the circuit and out of the circuit depending on the particular nature of the bits being received. By way of example, with a 2.2 volt differential signal on the network together with a 120 ohm termination resistance approximately 40 mW may be provided to the charge storage device. In addition, a data switch may be included to selectively switch on and off the power to the data request and receive module, to conserve power. As a further improvement, the design may switch to the included termination resistor when the charge storage device is full and cannot accept additional charge. The charge storage device, data logging device, and terminating resistors may be one device, or two or three physically separate devices. When they are separate devices, the charge storage device may connect to the data logging device via wiring, for example a power supply connection, or as an additional example a communications interface with a power supply connection. If a communications interface is used, it is preferably one that also provides power such as USB, but another interface such as I2C, SPI, or RS485 with a separate power supply connection may also be used.

Figure 5:
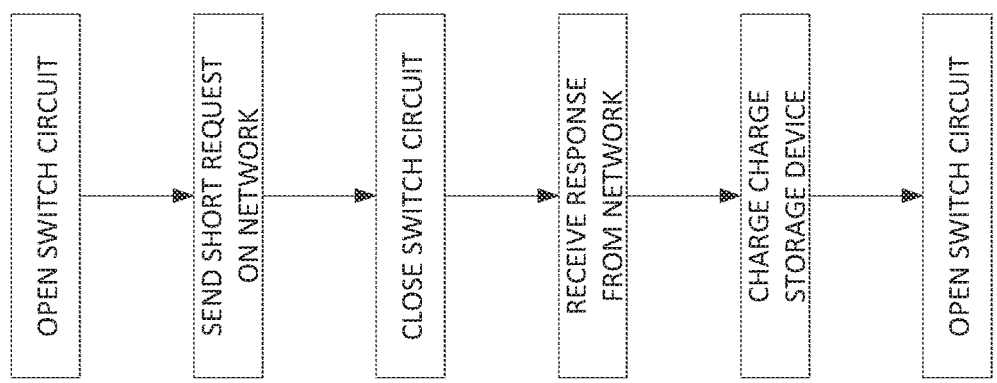
FIG. 5 illustrates a process of switching for the data logger of FIG. 4.

Referring also to FIG. 5, in order to increase the amount of charge for the charge storage device, it may be desirable to issue a relatively short request to one or more pieces of equipment which expends a first amount of energy from the charge storage device. The switch circuit is switched open. A data request switch is closed, and the request is transmitted on the network thus expending the first amount of energy. The request is designed in such a manner that the responsive data provided by the one or more energy monitoring devices includes substantially more data packets and thus a second amount of energy, which is substantially greater than the first amount of energy. In addition, if desired, after sending the request the switch circuit may be closed since it is known that the data being provided in response does not need to be decoded by the data request and receive module. Preferably, the amount of data received is 2 times or more the amount of data sent, and more preferably 5 times or more the amount of data sent, and more preferably 10 times or more the amount of data sent in this manner, the data logging device can add additional charge to the charge storage device. Further, the data logging module may include a charge monitoring circuit that selectively determines when additional charge is suitable to be obtained by sending out such requests in order to provide additional charge to the charge storage device.

Effective implementation of the invention may also benefit from the use of sleeping techniques to limit the power consumption. Included in these techniques by way of example is putting the main processor of the data logging device to sleep while transmitting data via a protocol peripheral on the main processor that consumes far less power than the processor itself. Similarly, while receiving data, the main processor need not be active, and as described elsewhere, in many cases the data can be safely ignored, such that the receiving peripheral on the device may sleep as well. In this way, the data logging device need only be away to process data in the receive buffer of the protocol peripheral, and to communicate the data via wireless network to a separate device or server.

Referring again to FIG. 4, the data logging device may include a transmission device. To alleviate the need to create a logical pathway past the gateway and/or firewall associated with the network, the data logging device preferably transmits its signal in a wireless manner to a network not included within the network associated with the building (e.g., the network included in the building as defined by the gateway and/or firewall). Preferably, the data is transmitted using a wireless network, such as a cellular network, in order to send the data for subsequent processing. The transmitting of the data for subsequent processing may be performed on a periodic basis, an aperiodic but calculated basis determined through data modeling or network optimization routines or otherwise upon request.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:

1. A data logging device comprising:
   a receiver configured to receive a signal comprising information to identify an addressee and information for the addressee;
   a switch circuit configured to provide the signal for using electrical energy of the signal;
   a resistive load connected to the switch circuit;
   a charge storage device connected to the resistive load and capable of being charged by the electrical energy of the signal;
   a processor configured to:
      receive the signal from the receiver;
      identify the addressee of the received signal from the received signal;
      in response to determining that the addressee is not the data logging device, close the switch circuit such that an electrical energy of the received signal representing the information for the addressee is provided to the resistive load to charge the charge storage device using the received signal.

2. The data logging device of claim 1, further comprising:
   a sensing device configured to monitor a piece of equipment proximate to the data logging device; and
   a transmitter configured to send monitored information to a requesting device.

3. The data logging device of claim 2, wherein the monitored information includes at least one of current, voltage, phase, and power usage associated with the piece of equipment.

4. The data logging device of claim 2, further comprising a memory, wherein the processor is further configured to store the monitored information in the memory.

5. The data logging device of claim 2, wherein the transmitter is configured to send the monitored information over a cellular network.

6. The data logging device of claim 1, further comprising a transmitter, wherein the processor is further configured to query a piece of equipment about at least one of current, voltage, phase, and power usage associated with the piece of equipment.

7. The data logging device of claim 1, further comprising a termination resistor.

8. The data logging device of claim 7, wherein in response to determining that the charge storage device is full, the processor routes the signal through the termination resistor.

9. The data logging device of claim 1, wherein the processor is further configured to:
   in response to determining that the charge storage device has a charge that is below a threshold, requesting a transmission from a piece of equipment; and
   close the switch circuit such that the resistive load charges the charge storage device using the requested transmission.

10. A computer-implemented method comprising:
    receiving a signal from a receiver of a data logging device, the signal comprising information to identify an addressee and information for the addressee;
    identifying the addressee of the received signal from the received signal;
    based on the addressee, closing a switch circuit such that electrical energy of the signal representing the information for the addressee is provided to a resistive load connected to the switch circuit to charge a charge storage device using the received signal.

11. The computer-implemented method of claim 10, further comprising:
    monitoring a piece of equipment to obtain information about the piece of equipment; and
    sending monitored information to a requesting device.

12. The computer-implemented method of claim 11, wherein the monitored information includes at least one of current, voltage, phase, and power usage associated with the piece of equipment.

13. The computer-implemented method of claim 11, further comprising storing the monitored information in memory.

14. The computer-implemented method of claim 11, sending the monitored information over a cellular network using a transmitter.

15. The computer-implemented method of claim 10, wherein in response to determining that the charge storage device is full, routing the received signal through a termination resistor.

16. The computer-implemented method of claim 10, further comprising:
    in response to determining that the charge storage device has a charge that is below a threshold,
        requesting a transmission from a piece of equipment; and
        closing the switch circuit such that the resistive load charges the charge storage device using a requested signal in response to the requested transmission.

17. The computer-implemented method of claim 10, wherein in response to determining that the addressee is not the data logging device, disconnect, via a data request switch, the charge storage device from a data request and receive module configured to encode and decode the signal.

18. A data logging device comprising:
    a data request and receive module comprising:
        a receiver configured to receive a signal over a network, the network comprising the data logging device and one or more network components, wherein the signal comprises information to identify an addressee and information for the addressee, and
        a processor configured to identify the addressee of the received signal from the received signal; and
    a charge storage circuit comprising:
        a charge storage device connected to a resistive load and capable of providing electrical energy to the data request and receive module and capable of being charged;
        a data request switch for providing electrical energy from the charge storage device to the data request and receive module,
        a switch circuit for providing the received signal to the resistive load;
    wherein in response to identifying that the addressee of the received signal is not the data logging device, the processor is configured to control the switch circuit to provide the received signal to the resistive load for charging the charge store device by using the electrical energy of the received signal representing the information for the addressee.

19. The data logging device of claim 18, in response to identifying that the addressee of the received signal is the data logging device, the processor is configured to initiate providing the received signal to the data request and receive module for decoding the information for the addressee of the received signal.

20. The data logging device of claim 18, further comprising:
    a charge monitoring circuit configured to determine a need for electrical energy to charge the charge storage device and initiate a request to at least one of the network components to provide one or more signals.

* * * * *

UNITED STATES PATENT AND TRADEMARK OFFICE
CERTIFICATE OF CORRECTION

Page 1 of 1

PATENT NO. : 10,965,136 B2
APPLICATION NO. : 16/209793
DATED : March 30, 2021
INVENTOR(S) : Zac Wheeler It is certified that error appears in the above-identified patent and that said Letters Patent is hereby corrected as shown below:

In the Claims

Column 8, Line 14 (approx.): In Claim 18, delete "store" and insert -- storage --, therefor.

Signed and Sealed this
First Day of June, 2021

Drew Hirshfeld
*Performing the Functions and Duties of the*
*Under Secretary of Commerce for Intellectual Property and*
*Director of the United States Patent and Trademark Office*